United States Patent [19]
Kim

[11] Patent Number: 5,973,553
[45] Date of Patent: Oct. 26, 1999

[54] APPARATUS FOR REMOVING ADDITIVE DISTURBANCE FROM DATA CHANNEL AND METHOD THEREFOR

[75] Inventor: Yung-soo Kim, Sungnam, Rep. of Korea

[73] Assignee: Samsung Electronics Co., Ltd., Suwon, Rep. of Korea

[21] Appl. No.: 09/016,932

[22] Filed: Feb. 2, 1998

[30] Foreign Application Priority Data

Feb. 19, 1997 [KR] Rep. of Korea .......................... 97-5041

[51] Int. Cl.⁶ ...................................................... H03K 5/00
[52] U.S. Cl. ............................ 327/551; 327/311; 327/34; 327/552
[58] Field of Search ..................................... 322/551, 552, 322/311, 34, 165, 310

[56] References Cited

U.S. PATENT DOCUMENTS 5,267,310  11/1993  Yoshiba .................................... 327/551
5,852,521  12/1998  Umeyama et al. ...................... 327/553

*Primary Examiner*—Dinh T. Le
*Attorney, Agent, or Firm*—Burns, Doane, Swecker & Mathis, L.L.P.

[57] ABSTRACT

An apparatus for detecting and removing an additive disturbance from a signal in a data transmission channel, and an method therefor. The apparatus includes: a disturbance detector which detects whether a disturbance exists in an input signal; a canceling signal generating portion which, when a disturbance is detected by the disturbance detector, generates a canceling signal beginning at the same time as the disturbance, based on a predetermined period of the input signal; and a disturbance remover which subtracts the canceling signal from the input signal to remove the disturbance. Therefore, the canceling signal is generated based on both the output and input signals, thereby precisely removing the disturbance.

11 Claims, 4 Drawing Sheets

APPARATUS FOR REMOVING ADDITIVE DISTURBANCE FROM DATA CHANNEL AND METHOD THEREFOR

This application claims priority under 35 U.S.C. §§119 and/or 365 to Appln. No. 97-5041 filed in Korea on Feb. 19, 1997; the entire content of which is hereby incorporated by reference.

BACKGROUND OF THE INVENTION

1. Field of the Invention

The present invention relates to an apparatus for detecting and removing additive disturbance on a data transmission channel, and a method therefor, and more particularly, to an apparatus for removing disturbance included in an output signal of a magneto-resistive head sensor, caused by contact with a recording surface of a rotating magnetic disk, and a method therefor.

2. Description of the Related Art

In general, in a data channel where a signal is detected using a magneto-resistive sensor (MR sensor) head which is supported on an air layer formed between a slider assembly and a rotating magnetic disk, heat is generated if the MR sensor ever contacts the recording surface of the rotating magnetic disk. Such heat generated at the contact point raises the temperature of the MR sensor by approximately 1° C. for 50~100 nanoseconds. The resistance of the MR sensor is dependent on temperature, and thus increases. The heat generated at the contact point then dissipates into the periphery of the sensor, thereby lowing the resistance back to the original value. Since the MR sensor converts change in magnetic information into a voltage signal, the change in resistance due to the heat acts as an additive disturbance to the output of the MR sensor, resulting in a disturbance mixed with the original data, also known as a thermal asperity transient. The amplitude of such thermal disturbance signal may be four times or more that of the original signal.

Such disturbance to the data signal causes a serious problem for signal detection. In the first stage of the signal detection, it is very difficult to achieve an automatic gain control unit capable of tolerating the disturbance. Even when the automatic gain control unit can perform its own operation during the disturbance, the phase of the signal is disturbed and it is impossible to subsequently fine the exact phase of the signal, in a timing recovery unit. The timing recovery unit does not operate normally over a period of hundreds of or more data symbols, until the amplitude of the disturbance decreases to a negligible level compared to the signal. Also, it takes a long time to find the exact phase. Thus, there are required a method and an apparatus for removing from a playback signal disturbance due to the change in temperature of an MR sensor, caused by the MR sensor contacting the recording surface of the rotating magnetic disk. Here, the disturbance must be eliminated prior to the signal processing through the automatic gain control unit, timing recovery unit and equalization unit, in order to minimize the effect of the disturbance on these circuits.

To solve the problems and meet the above requirement, there has been suggested a method for canceling out the disturbance by adding a corrective feedback signal fed back from the output to the input signal with the disturbance. The corrective feedback signal is an estimation of the disturbance, and is obtained using a non-linear adaptive filter from a differential signal calculated from the envelope of the output signal using an envelope detector and a differentiator installed at the output. However, when estimating the disturbance, only the output signal is used, and the input signal is not monitored at all. As a result, there is a time delay between the start of the disturbance and when the corrective feedback signal begins to compensate for the disturbance, during which the disturbance is not corrected at all.

SUMMARY OF THE INVENTION

To solve the above problems, it is an object of the present invention to provide an apparatus for completely removing additive disturbance from a signal input to a data, by using an input signal as well as an output signal to estimate and generate a canceling signal, and a method therefor.

According to an aspect of the present invention, there is provided an apparatus for removing an additive disturbance from a data transmission channel, comprising: a disturbance detector which detects whether a disturbance exists in an input signal; a canceling signal generating portion which, when a disturbance is detected by the disturbance detector, generates a canceling signal beginning at the same time as the disturbance, based on a predetermined period of the input signal; and a disturbance remover which subtracts the canceling signal from the input signal to remove the disturbance.

According to another aspect of the present invention, there is provided a method for removing an additive disturbance from a data transmission channel, comprising the steps of: (a) detecting the starting point of a disturbance in an input signal; (b) adaptively generating a canceling signal based on the input signal and a feedback control signal; (c) subtracting the canceling signal from the input signal to remove the disturbance; and (d) detecting a baseline of the output signal of the step (c) and outputting the baseline as the feedback control signal.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 1:
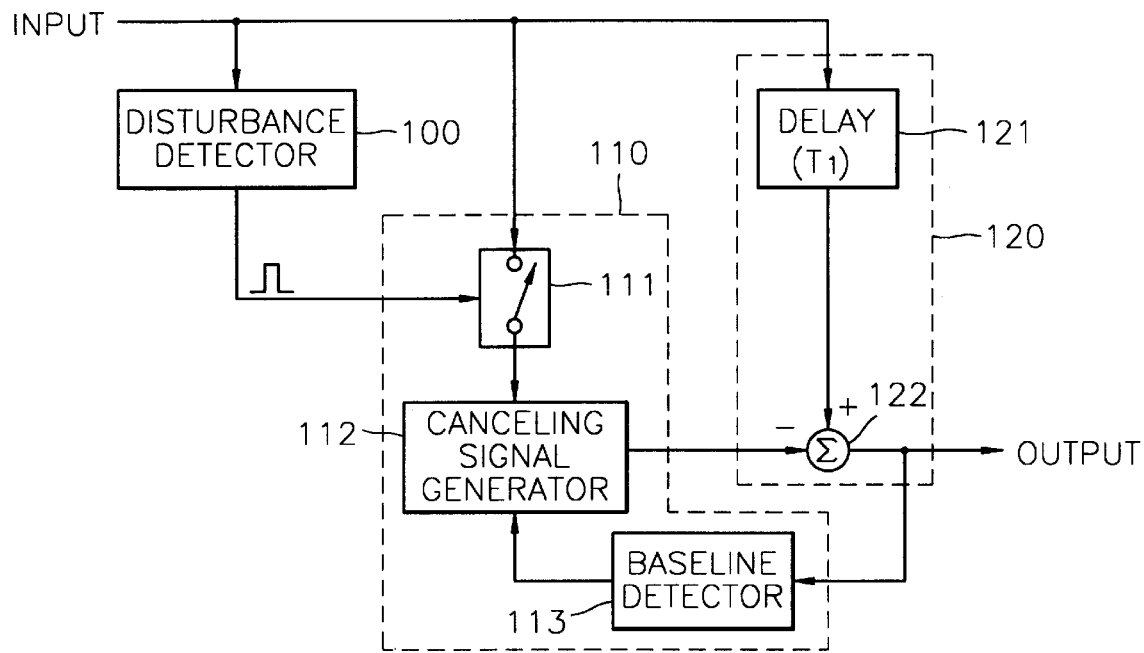
FIG. 1 is a block diagram showing an apparatus for removing additive disturbance from a data channel according to the present invention.

In FIG. 1, an apparatus for removing additive disturbance from a data channel according to a preferred embodiment of the present invention includes a disturbance detector 100, a canceling signal generating portion 110 and a disturbance remover 120.

Figure 2:
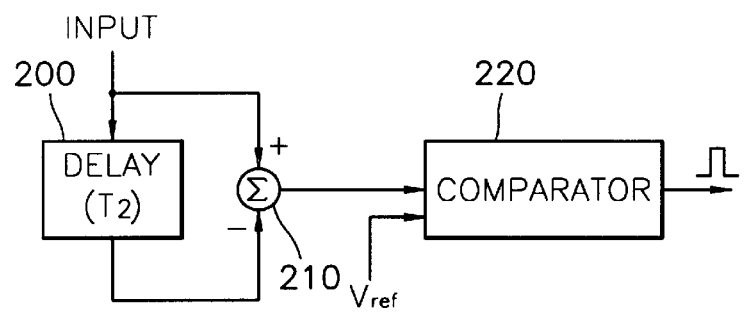
FIG. 2 is a block diagram of a disturbance detector of FIG. 1.

The disturbance detector 100 detects a disturbance in the input signal and outputs a logic pulse of a predetermined width. The disturbance detector 100, as shown in FIG. 2, includes a delay 200 which delays the input signal by a predetermined time $T_2$, a subtractor 210 which subtracts the delayed signal from the input signal, and a comparator 220 which compares the output of the subtractor 210 with a predetermined reference value to output a pulse having a predetermined width.

The canceling signal generating portion 110 includes a switch 111, a canceling signal generator 112 and a baseline detector 113. The switch 111 passes the input signal when turned on by the output pulse of the disturbance detector 100. The canceling signal generator 112 adaptively generates the canceling signal using the input signal passed by the switch 111 and a feedback control signal. The baseline detector 113 detects the baseline of the output of the disturbance remover 120 and feeds back the detected baseline to the canceling signal generator 112.

Figure 3:
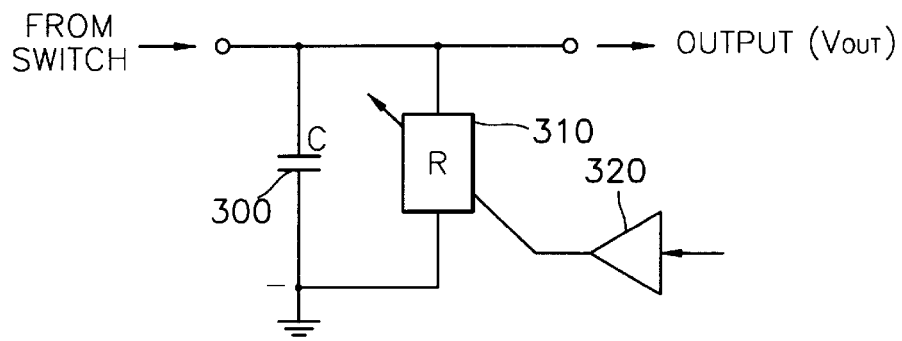
FIG. 3 is a diagram showing an example of the canceling signal generator of FIG. 1.

The canceling signal generator 112, as shown in FIG. 3, includes a capacitor 300 which stores an input signal input while the switch 111 is turned on, a variable resistor 310 connected in parallel with the capacitor 300, whose resistance varies according to the output signal of an attenuator 320 which controls the amplitude of the feedback control signal.

Figure 4:
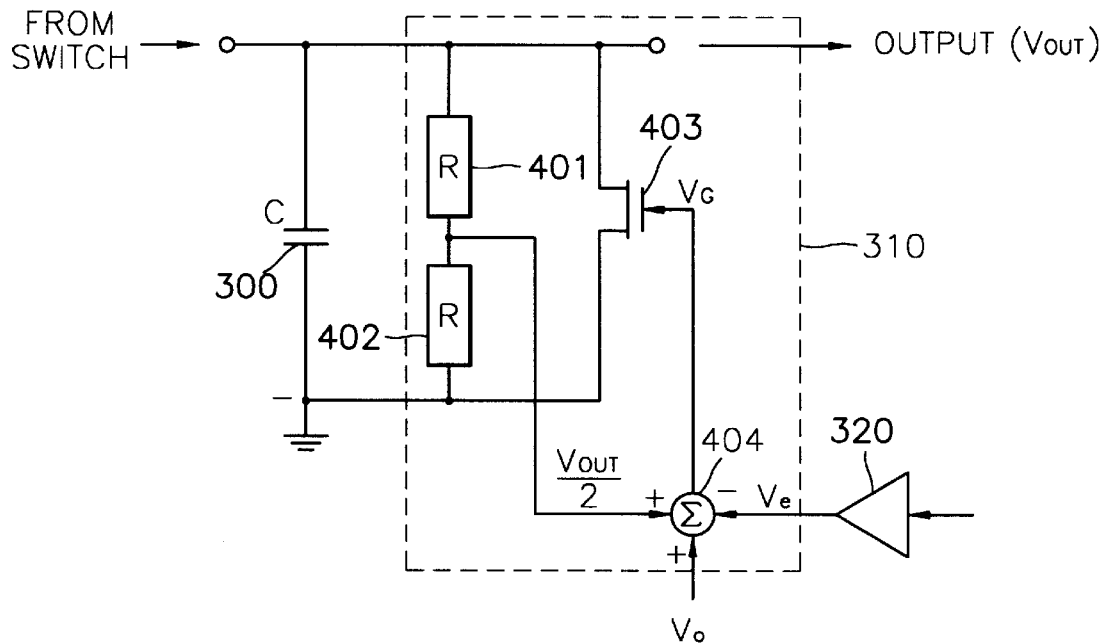
FIG. 4 is a diagram showing a possible implementation of the canceling signal generator of FIG. 1.

FIG. 4 shows a possible implementation of the canceling signal generator 112. The canceling signal generator 112 of FIG. 4 includes two resistors 401 and 402 which are connected in series and have the same resistance as each other, a capacitor 300 connected in parallel with the two resistors 401 and 402, an N-type MOSFET 403 having a source and drain connected in series with the capacitor 300, the source being grounded and the drain being connected to an output $V_{out}$, a subtracter 404 having a first adding input connected between the two resistors 401 and 402, a second adding input for receiving a predetermined reference voltage $V_0$, a subtracting input receiving the output voltage of the attenuator 320, and an output connected to the gate of the MOSFET 403. The resistors 401 and 402, the MOSFET 403 and the subtractor 404 together constitutes the variable resistor 310.

The disturbance remover 120 includes a delay 121 and a subtractor 122. The delay 121 delays the input signal by a predetermined time $T_1$. The subtractor 122 subtracts the canceling signal generated by the canceling signal generating portion 110 from the output of the delay 122.

Figure 5:
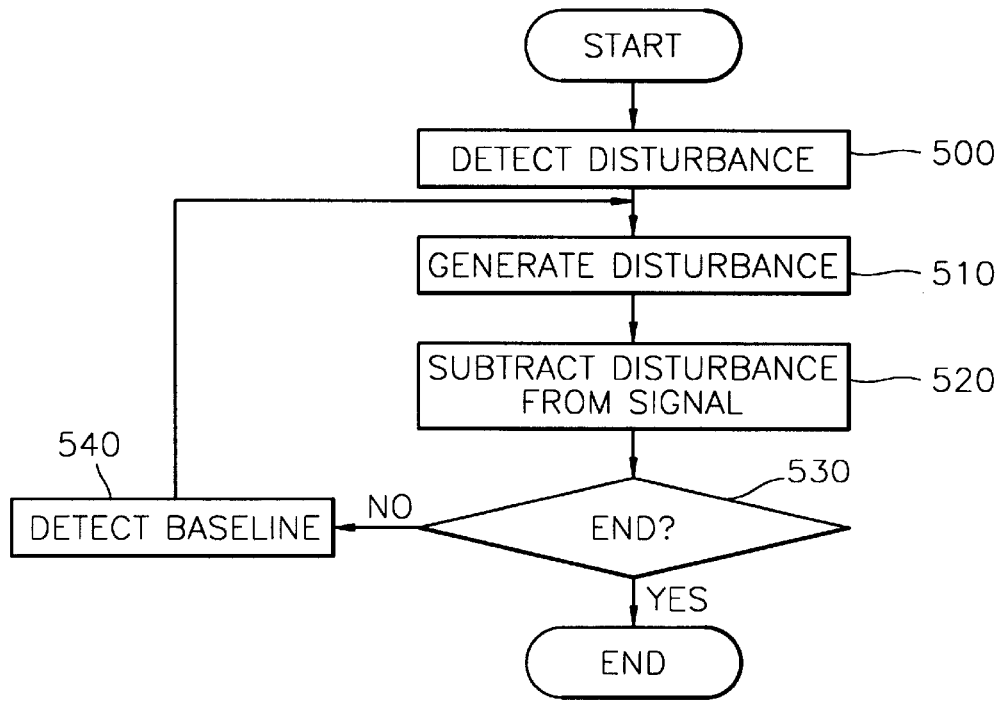
FIG. 5 is a flowchart representing a method for removing additive disturbance from a data channel according to the present invention.
Figure 6:
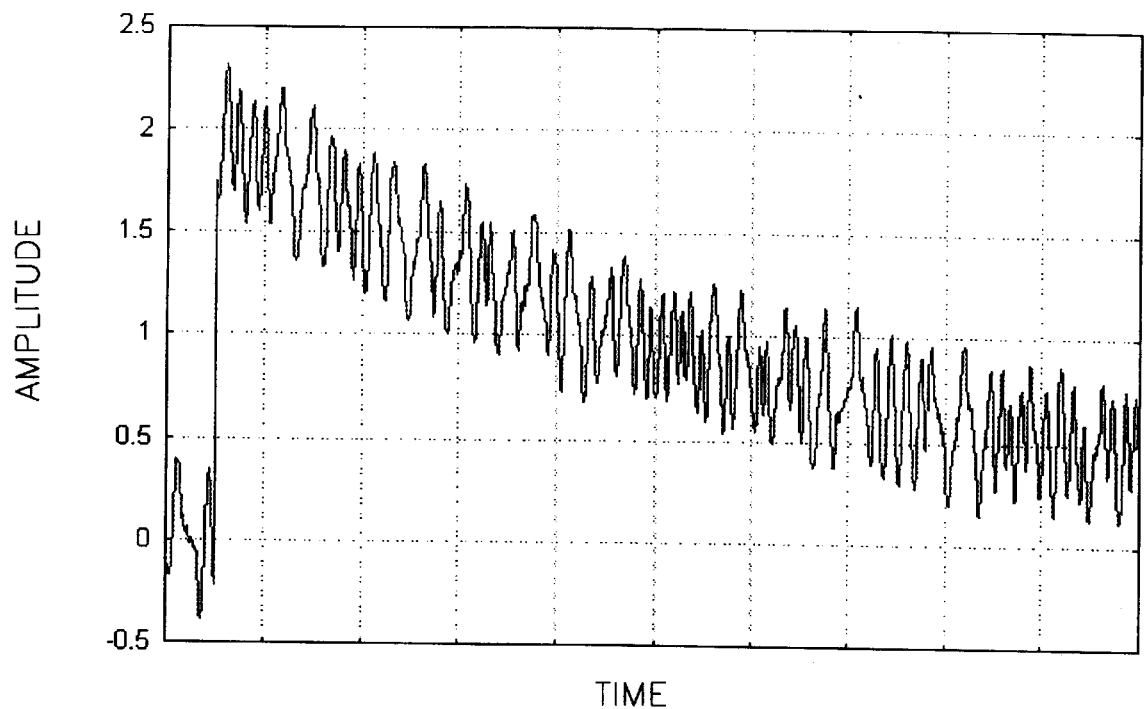
FIG. 6 is a diagram showing an input signal of the data channel, having the additive transient disturbance.

The operation of the apparatus for removing the additive disturbance will be described based on the above-described structure, and referring to FIGS. 5 and 6. As shown in FIG. 6, since thermal dissipation is modeled as an exponential function, the disturbance decays exponentially after the initial abrupt increase.

First, if a signal with a disturbance, as shown in FIG. 6, is input, the disturbance is detected by the disturbance detector 100 and a pulse having a predetermined width is output at the beginning of the disturbance (step 500). The output pulse of the disturbance detector 100 turns the switch 111 on for the duration of the pulse, which is equal to $T_2$. The canceling signal generator 112 generates the canceling signal by receiving the input signal which has passed through the switch 111, and the feedback control signal input from the baseline detector 113 (step 510). Also, the input signal is delayed by $T_1$ by the delay 121, and the output of the canceling signal generator 112 is subtracted from the delayed signal by the subtractor 122, resulting in a signal from which the disturbance is eliminated (step 520). Here, $T_1$ is determined such that the input signal reaches the subtractor 122 at the same time as the canceling signal. Then, it is checked whether the disturbance is completely removed (step 530). If the disturbance is completely removed, the performance is stopped. Otherwise, the output signal is fed back to the baseline detector 113. There, the disturbance remaining in the feedback signal is estimated as the average of the envelopes, that is, average of positive and negative envelopes (step 540). The result is fed back to the canceling signal generator 112.

The operation of the above-described disturbance detector 100 is as follows. A signal input to the disturbance detector 100 is delayed by the delay 200 for a time $T_2$, and then subtracted from the original signal input to the disturbance detector 100 by the subtracter 210. Then, the subtraction result is compared with a reference voltage $V_{ref}$ by the comparator 220, to output a pulse while the subtraction result is greater than $V_{ref}$. The output pulse turns on the switch 111 for the duration of the pulse width.

The canceling signal generator 112 of FIG. 3 operates as follows. The signal input to the canceling signal generator 112 while the switch 111 is turned on is stored in the capacitor 300. Here, $T_2$ must he long enough to sample the disturbance in the input signal. When the switch 111 is turned off, the voltage stored in the capacitor 300 is discharged through the variable resistor 310, reflecting the exponential decay of the disturbance. The initial resistance of the variable resistor 310 and the capacitance of the capacitor 300 are determined such that the decay rate of the generated canceling signal matches the average disturbance characteristics. However, if a disturbance is different from the average characteristics, the disturbance of the input signal is not removed completely, so that the amplitude of the baseline must be controlled by the attenuator 320 after the baseline of the output signal is detected by the base detector 113. The variable resistor 310 is adaptively varied according to the output signal of the attenuator 320, to generate a canceling signal different from the average.

The variable resistor 310 may be implemented using an N-type MOSFET 403 as shown in FIG. 4. Here, the operation of the canceling signal generator of FIG. 4 is the same as that of FIG. 3 except for the operation of the variable resistor 310. That is, the output $V_{out}/2-V_e+V_o$ of the subtractor 404 is input to the MOSFET 403 as a gate voltage $V_G$ to adjust resistance. Here, $V_e$ represents the output voltage of the attenuator 320, and $V_o$ is determined such that the MOSFET 403 operates in an ohmic region. The inverse of a time constant $\tau$ determining the exponential decay rate of the generated canceling signal changes linearly according to the output $V_e$ of the attenuator 320.

$$\frac{1}{\tau} = \frac{1}{C}\left[\frac{1}{2R} + k(V_o - V_e - V_t)\right]$$

where k is a constant representing the characteristics of the MOSFET, and $V_t$ is the threshold voltage of the MOSFET. The inverse of the effective resistance between the drain and source of the MOSFET changes linearly according to the output $V_e$ of the attenuator 320. Also, when $V_e$ is equal to zero, the characteristics of the canceling signal are equal to the average characteristics of the additive disturbance.

Figure 7:
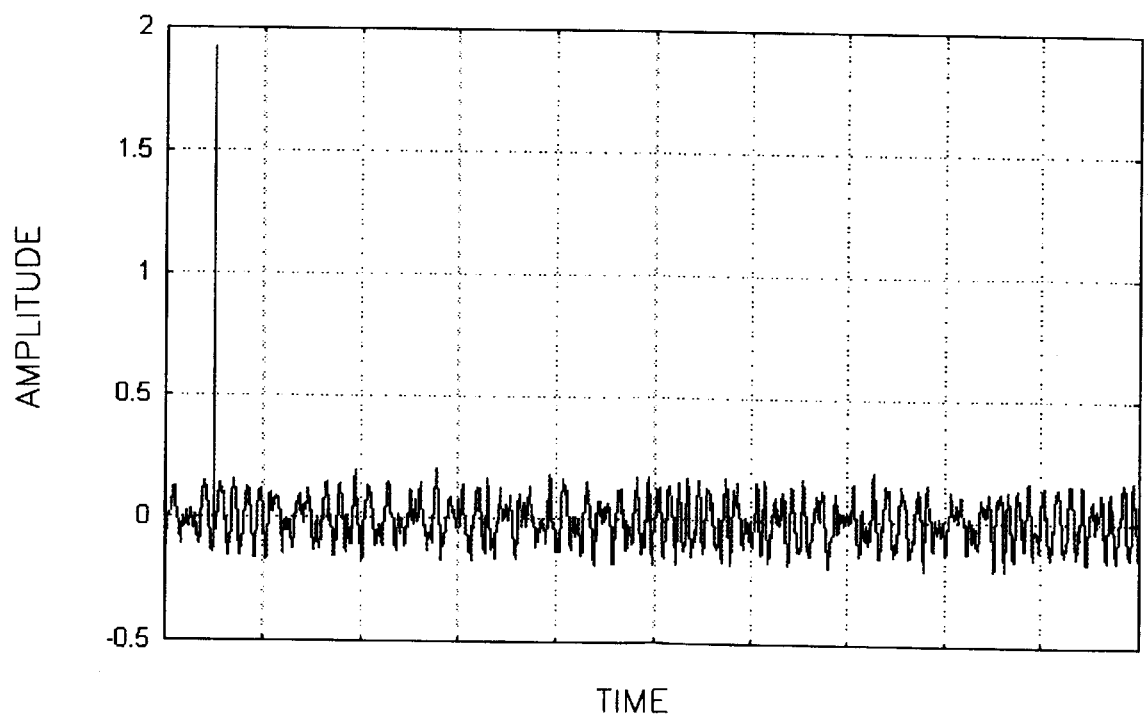
FIG. 7 is a diagram showing the output signal of a subtractor of the disturbance detector of FIG. 2.
Figure 8:
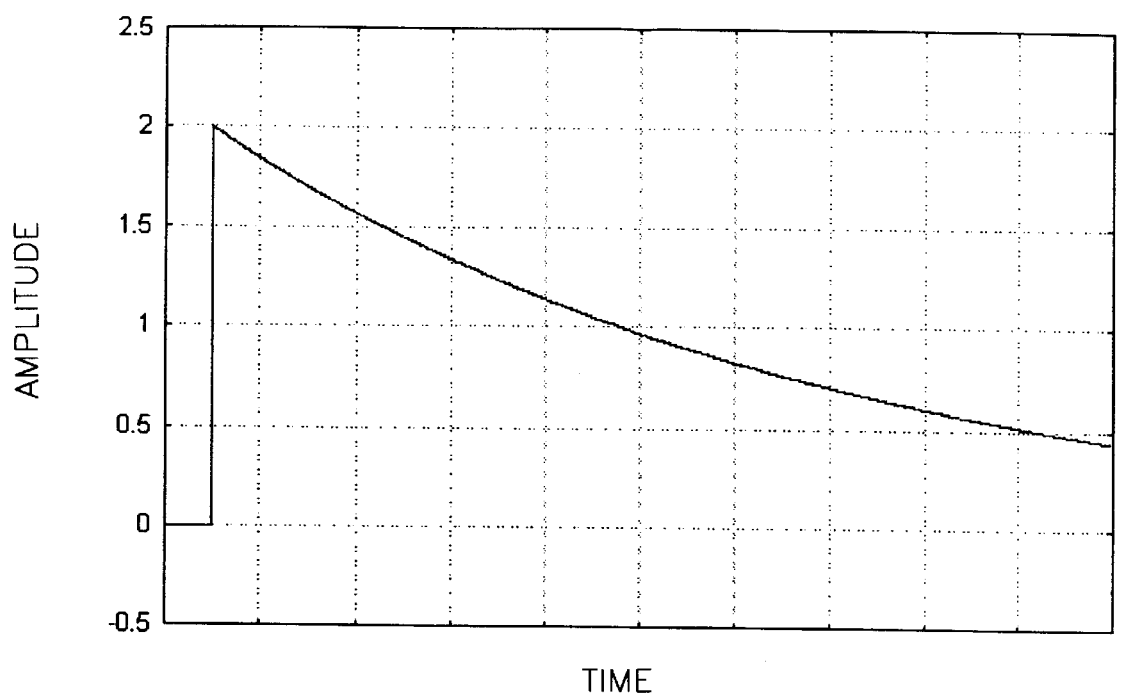
FIG. 8 is a diagram showing the output signal of the canceling signal generator of FIG. 3.
Figure 9:
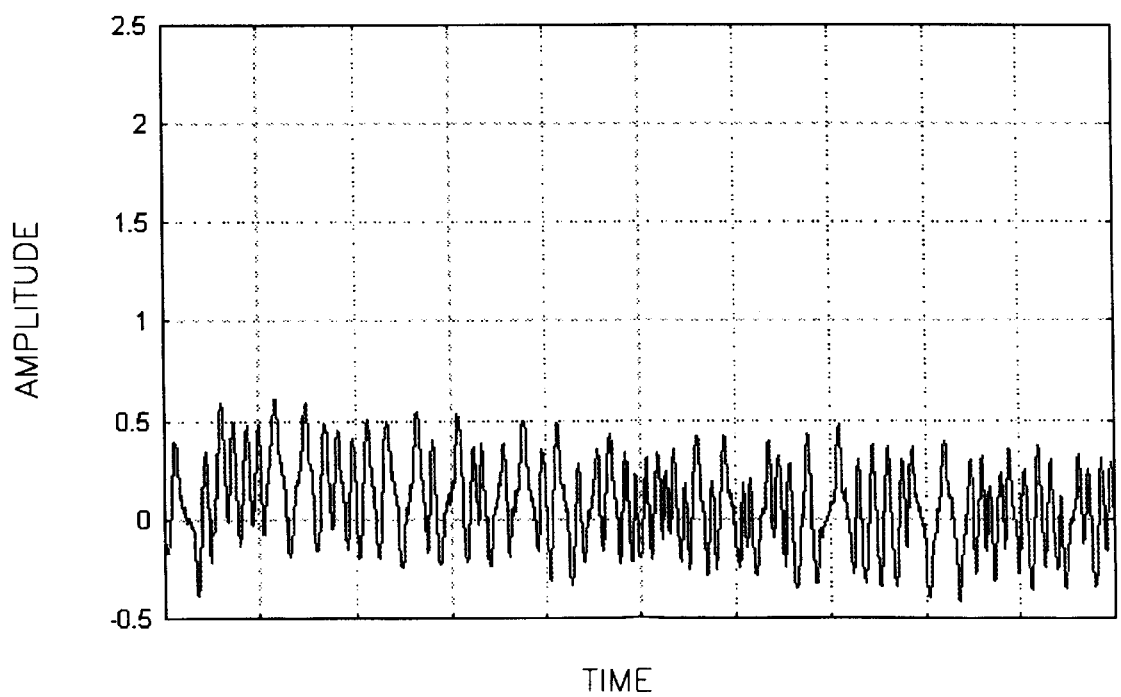
FIG. 9 is a diagram showing a final output signal, from which the disturbance is removed.

FIG. 7 shows the signal output from the subtractor 210 of FIG. 2 when the signal containing a disturbance, as shown in FIG. 6, is input. Also, FIGS. 8 and 9 respectively show the canceling signal generated by the canceling signal generator 112 and the final output signal, from which the disturbance is eliminated.

The present invention provides a data transmission channel without additive disturbance, by removing disturbances such as thermal asperity transients which are caused by the MR sensor contacting the surface of the magnetic disk. According to the present invention, if a signal input to the channel includes a disturbance, the disturbance is detected and the amplitude thereof is estimated. First, values of the internal circuit components are selected such that the disturbance having he average characteristics is removed. However, if the decay characteristics of the disturbance are different from the average characteristics, the decay of that disturbance is modified adaptively. As a result, a canceling signal can be very precisely generated, thereby removing the disturbance from the channel input signal.

What is claimed is:

1. An apparatus for removing an additive disturbance from a data transmission channel, for generating an output signal at an output terminal, comprising:

a disturbance detector which detects whether said additive disturbance exists in an input signal;

a canceling signal generating portion operatively connected to said disturbance detector which, when said additive disturbance is detected by the disturbance detector, generates a canceling signal beginning at the same time as the disturbance, based on a predetermined period of the input signal, wherein the canceling signal generating portion comprises:

a switch which passes the input signal when turned on by an output of the disturbance detector;

a canceling signal generator which adaptively generates the canceling signal based on the input signal input while the switch is turned on and on a feedback control signal; and a baseline detector which detects a baseline of the output signal to generate the feedback control signal; and a disturbance remover operatively connected to said canceling signal generating portion which subtracts the canceling signal from the input signal to generate said output signal.

2. The apparatus of claim 1, wherein the disturbance detector comprises:

a delay which delays the input signal by a predetermined time;

a subtractor which subtracts the delayed signal from the input signal; and a comparator which compares an output of the subtractor with a predetermined reference value to output a logic signal.

3. The apparatus of claim 1, wherein the canceling signal generator comprises:

a capacitor which stores the input signal input while the switch is turned on;

an attenuator which controls amplitude of the feedback control signal; and a variable resistor having a resistance value in parallel with the capacitor, wherein the resistance value is varied according to the output of the attenuator.

4. The apparatus of claim 3, wherein the switch is turned on for a time long enough for the capacitor to sample the disturbance present in the input signal.

5. The apparatus of claim 3, wherein capacitance of the capacitor and an initial resistance of the variable resistor are determined such that a decay rate of the canceling signal matches an average characteristics of the disturbances in the input signal.

6. The apparatus of claim 5, wherein the variable resistor comprises:

two resistors connected in series as a voltage divider, having the same resistance value;

a subtractor which adds a predetermined reference voltage to voltage at a junction between the two resistors, and subtracts an output of the attenuator; and an N-type MOSFET connected in parallel with the two resistors, which receives an output of the subtractor as a gate voltage.

7. The apparatus of claim 6, wherein the predetermined reference voltage is determined such that the N-type MOSFET operates in a linear response region.

8. The apparatus of claim 1, wherein the disturbance remover comprises:

a delay which delays the input signal by a predetermined time; and a subtractor which subtracts the canceling signal from the delayed input signal to output a signal from which the disturbance is removed.

9. The apparatus of claim 8, wherein the delay delays the input signal such that the input signal reaches the subtractor at the same time as the canceling signal.

10. A method for removing an additive disturbance from a data transmission channel, to generate an output signal at an output terminal, comprising the steps of:

(a) detecting a starting point of the additive disturbance in an input signal;

(b) adaptively generating a canceling signal based on the input signal and a feedback control signal from said output terminal;

(c) subtracting the canceling signal from the input signal to remove the additive disturbance; and (d) detecting a baseline of said output signal of the step (c) and outputting the baseline as the feedback control signal.

11. The method of claim 10, wherein in the step (d), the baseline is obtained from an average of positive and negative envelopes of the output signal of the step (c).

* * * * *